United States Patent
McGuinness et al.

(10) Patent No.: US 11,551,921 B1
(45) Date of Patent: Jan. 10, 2023

(54) MINIATURIZED VACUUM PACKAGE AND METHODS OF MAKING SAME

(71) Applicant: National Technology & Engineering Solutions of Sandia, LLC, Albuquerque, NM (US)

(72) Inventors: Hayden James Evans McGuinness, Albuquerque, NM (US); Michael Gehl, Edgewood, NM (US); Christopher Todd DeRose, Albuquerque, NM (US); Lambert Paul Parazzoli, Lavallette, NJ (US); Raymond A. Haltli, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/500,555

(22) Filed: Oct. 13, 2021

Related U.S. Application Data

(63) Continuation-in-part of application No. 17/030,889, filed on Sep. 24, 2020, now Pat. No. 11,150,609.

(60) Provisional application No. 62/905,835, filed on Sep. 25, 2019.

(51) Int. Cl.
| | |
|---|---|
| *H01J 49/42* | (2006.01) |
| *H01J 49/00* | (2006.01) |
| *H01L 23/10* | (2006.01) |
| *H01J 49/24* | (2006.01) |

(Continued)

(52) U.S. Cl.
CPC ........ *H01J 49/4255* (2013.01); *B81B 7/0035* (2013.01); *B81C 1/00277* (2013.01); *B81C 1/00301* (2013.01); *B81C 1/00317* (2013.01); *H01J 49/0018* (2013.01);
(Continued)

(58) Field of Classification Search
CPC ....... G06N 10/00; G06N 10/40; H01J 49/422; H01J 49/0018; H01J 49/424; H01J 49/24; G04F 5/14; H01L 23/10; H01L 2224/73265; H01L 2224/85; H01L 24/85; H01L 24/89; B81B 7/0041; B81B 7/0035; B81B 7/007; B81C 1/00269; B81C 1/00277; B81C 1/0029; B81C 1/00309; B81C 1/00317
See application file for complete search history.

(56) References Cited

U.S. PATENT DOCUMENTS

| | | | |
|---|---|---|---|
| 7,411,187 B2 * | 8/2008 | Monroe | B82Y 10/00 257/17 |
| 7,859,350 B1 | 12/2010 | Schwindt et al. | |
| 2009/0151972 A1 * | 6/2009 | Potter | H01L 24/83 228/115 |

FOREIGN PATENT DOCUMENTS

| | | | | |
|---|---|---|---|---|
| WO | WO-2006067784 A1 * | 6/2006 | ........... | B81B 7/0038 |
| WO | WO2021006811 A1 | 1/2021 | | |

OTHER PUBLICATIONS

Aikyo, Yuhi, et al. "Vacuum characterization of a compact room-temperature trapped ion system." Applied Physics Letters 117.23 (2020): 234002. (Year: 2020).*

(Continued)

*Primary Examiner* — Ryan Johnson

(74) *Attorney, Agent, or Firm* — Martin I. Finston; Mark A. Dodd

(57) ABSTRACT

The present disclosure relates to an integrated package having an active area, an electrical routing circuit, an optical (Continued)

routing circuit, and a vacuum vessel. Methods of making such a package are also described herein.

20 Claims, 13 Drawing Sheets

(51) Int. Cl.
B81C 1/00 (2006.01)
B81B 7/00 (2006.01)
(52) U.S. Cl.
CPC ............ *H01J 49/24* (2013.01); *H01J 49/422* (2013.01); *H01L 23/10* (2013.01)

(56) References Cited

OTHER PUBLICATIONS

Setzer, W. J., et al. "Fluorescence detection of a trapped ion with a monolithically integrated single-photon-counting avalanche diode." Applied Physics Letters 119.15 (2021): 154002. (Year: 2021).*
Aslan, M. M. et al., "Low-Loss Optical Waveguides for the Near Ultra-Violet and Visible Spectral Regions with Al2O3 Thin Films from Atomic Layer Deposition," Thin Solid Films, 2010, vol. 518, pp. 4935-4940.
Borregaard, J. and Sorensen, A. S., "Efficient Atomic Clocks Operated with Several Atomic Ensembles," Physical Review Letters, 2013, vol. 111, pp. 090802-1-090802-8.
DeRose, C. T. et al., "Ultra compact 45 GHz CMOS compatible Germanium waveguide photodiode with low dark current," Optics Express, 2011, vol. 19, pp. 24897-24904.
DeRose, C. T. et al., "High Speed Traveling Wave Carrier Depletion Silicon Mach-Zehnder Modulator," Optical Interconnects Conference, Santa Fe, NM, 2012 2pages.
DeRose, C. T. et al., "Silicon Microring Modulator with Integrated Heater and Temperature Sensor for Thermal Control," OSA / CLEO/QELS, 2010, 2 pages.
Jau, Y-Y. et al., "Low-power, miniature 171Yb ion clock using an ultra-small vacuum package," Applied Physics Letters, 2012, vol. 101, pp. 253518-1-253518-4.
Jones, A. M. et al., "Ultra-low crosstalk, CMOS compatible waveguide crossings for densely integrated photonic interconnection networks", Optics Express, 2013, vol. 21, pp. 12002-12013.
Lentine, A. L. et al., "Silicon Photonics for National Security Applications," 2015 IEEE Aerospace Conference, 2015, pp. 1-9, doi: 10.1109/AERO.2015.7119249.
Lentine, A. L. et al., "Active Wavelength Control of Silicon Microphotonic Resonant Modulators," in Optical Interconnects Conference, 2012, IEEE.
Martinez, N. J. D. et al., "Single photon detection in a waveguide-coupled Ge-on-Si lateral avalanche photodiode," Optics Express, 2017, vol. 25, pp. 16130-16139.
Tamm, Chr. et al., "171Yb+ Single-Ion Optical Frequency Standard at 688 THz," IEEE Transactions on Instrumentation, and Measurement, 2007, vol. 56, pp. 601-604.
Schioppo, M. et al., "Ultrastable optical clock with two cold-atom ensembles," Nature Photonics, 2016, vol. 11, pp. 48-53.
Schwindt, P.D.D. et al., "A highly miniaturized vacuum package for a trapped ion atomic clock," Review of Scientific instruments, 2016, vol. 87, pp. 053112-1-053312-9.
Manginel, R. P. et al., "In situ dissolution or deposition of Ytterbium (Yb) metal in microhotplate wells for a miniaturized atomic clock," Optics Express, 2012, vol. 20, pp. 24650-24663.
Stenger, J. et al., "Absolute frequency measurement of the 435.5-nm 171Yb+-clock transition with a Kerr-lens mode-locked femtosecond laser," Optics Letters, 2001, vol. 26, pp. 1589-1591.
Weigel, P. O. et al., "Hybrid Silicon Photonic-Lithium Niobate Electro-Optic Mach-Zehnre Beyond 100 GHz," Arxiv, 2018, pp. 1-19.
Zortman, W. A. et al., "Low voltage differentially signaled modulators," Optics Express, 2011, vol. 19, pp. 26017-26026.
Brewer, S. M. et al., "A high-accuracy mobile Al+ optical clock," 2014, IEEE International Frequency Control Symposium (FCS), 1 pages.
Dube, P. et al., "Evaluation of systematic shifts of the 88Sr+ single-ion optical frequency standard at the 10-17 level," Physical Review A, 2013, vol. 87, pp. 023806-1-023806-18.
Dube, P. et al., "Electric Quadrupole Shift Cancellation in Single-Ion Optical Frequency Standards," Physical Review Letters, 2005, vol. 95, pp. 033001-033001-4.
Itano, W. M., et al., "Quantum projection noise: Population fluctuations in two-level systems," Physical Review A, 1993, vol. 47, pp. 3554-3570.
Katzenmeyer, A. M. et al., "Volumetric Imaging and Characterization of Focusing Waveguide Grating Couplers," IEEE Photonics Journal, 2017, vol. 9, 10 pages.
Keller, J. et al., "Probing Time Dilation in Coulomb Crystals in a High-Precision Ion Trap," Physical Review Applied, 2019, vol. 11, pp. 011002-1-011002-7.
Kielpinski, D. C., et al., "Architecture for a large-scale ion-trap quantum computer," Nature, 2002, vol. 417, pp. 709-711.
Lalau-Keraly, C. M. et al., "Adjoint shape optimization applied to electromagnetic design," Optics Express, 2013, vol. 21, pp. 21693-21701.
Maunz, P., "High Optical Access Trap 2.0," SAND2016-0796R, Sandia National Laboratories (Jan. 26, 2016), 88 pages.
Mehta, K. K. and Ram, R. J., "Precise and diffraction-limited waveguide-to-free-space focusing gratings," Scientific Reports, 2017, vol. 7, 9 pages.
Moehring, D. L. et al., "Design, fabrication and experimental demonstration of junction surface ion traps," New Journal of Physics, 2011, vol. 13, 8 pages.
Niffenegger, R. J. et al., "Integrated optical control and enhanced coherence of ion qubits via multi-wavelength photonics," arXiv.org, arXiv:2001.05052 v1 (2020), 9 pages.
Payne, F. P. and Lacey, J. P. R., "A theoretical analysis of scattering loss from planar optical waveguides," Optical and Quantum Electronics, 1994, vol. 26, pp. 977-986.
Rosenband, T. and Leibrandt, D. R., "Exponential scaling of clock stability with atom number," 2013, arXiv:1303.6357v2, 5 pages.
Savchenkov, A. A. et al., "Stabilization of a Kerr frequency comb oscillator," Optics Letters, 2013, vol. 38, pp. 2636-2639.
Schneider, T. et al., "Sub-Hertz Optical Frequency Comparisons between Two Trapped 171 Yb+ Ions," Physical Review Letters, 2005, vol. 94, pp. 230801-1-230801-4.
Schwindt, P. D. D. et al., "Miniature Trapped-Ion Frequency Standard with 171Yb +," 2015, Joint Conference of the IEEE International Frequency Control Symposium & the European Frequency and Time Forum, 6 pages.
Scherer, D. R. et al., "Progress on a Miniature Cold-Atom Frequency Standard," 2014, https://arxiv.org/abs/1411.5006, 10 pages.
Sebby-Strabley, J. et al., "Design Innovations Towards Miniaturized GPS-quality Clocks," 2016, IEEE International Frequency Control Symposium (IFCS), 6 pages.
Shappert, C. M. et al., "Spatially uniform single-qubit gate operations with near-field microwaves and composite pulse compensation," New Journal of Physics, 2013, vol. 15, 12 pages.
Warren, W. S. et al., "Multiple phase-coherent laser pulses in optical spectroscopy I. The technique and experimental applications," The Journal of Chemical Physics, 1983, vol. 78, pp. 2279-2297.
Xuan, Y. et al., High-Q silicon nitride microresonators exhibiting low-power frequency comb initiation, Optica, 2016, vol. 3, pp. 1171-1180.
Lucas, D. M. et al., "Isotope-selective photoionization for calcium ion trapping," Physical Review A, 2004, vol. 69, pp. 012711-1-012711-13.
West, G. N. et al., "Low-loss integrated photonics for the blue and ultraviolet regime," APL Photonics, 2019, vol. 4, pp. 026101-1-026101-7.
Shu, G. et al.,"Efficient fluorescence collection and ion imaging with the "tack" ion trap," Journal of the Optical Society of America B., 2011, vol. 28, pp. 2865-2870.

(56) References Cited

OTHER PUBLICATIONS

McLoughlin, J. J. et al., "Versatile ytterbium ion trap experiment for operation of scalable ion-trap chips with motional heating and transition-frequency measurements," Physical Review A, 2011, vol. 83, pp. 013406-1-013406-9.

* cited by examiner

MINIATURIZED VACUUM PACKAGE AND METHODS OF MAKING SAME

CROSS-REFERENCE TO RELATED APPLICATION

This application is a continuation-in-part of prior U.S. patent application Ser. No. 17/030,889, filed Sep. 24, 2020, by Lambert Paul Parazzoli et al. under the title "TRAPPED ION PLATFORM WITH OPTICAL INPUT AND OUTPUT", which in turn claims the benefit of U.S. Provisional Patent Application No. 62/905,835, filed Sep. 25, 2019. Each of these is incorporated herein by reference in its entirety.

STATEMENT OF GOVERNMENT INTEREST

This invention was made with Government support under Contract No. DE-NA0003525 awarded by the United States Department of Energy/National Nuclear Security Administration. The U.S. Government has certain rights in the invention.

FIELD

The present disclosure relates to an integrated package having an active area, an electrical routing circuit, an optical routing circuit, and a vacuum vessel. Methods of making such a package are also described herein.

BACKGROUND

Surface ion trap detectors generally rely on controlling various types of input and output signals, including electrical and optical signals. Difficulties can arise when trying to maximize coupling of such signals to the detector, while attempting to minimize overall size.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

The present disclosure relates to an integrated package that facilitates electrical and optical access to active areas of a device, while also providing the active area with a controlled, vacuum environment. In particular, the package employs an integrated component having embedded electrical and optical routing circuits. Disposed on a top surface of the integrated component is an active area, which includes one or more structures configured for sensing or detecting. This active area, in turn, is configured to communicate or connect with the electrical and optical routing circuits.

A controlled environment is provided for the active area by employing a vacuum vessel. In use, the vacuum vessel is bonded to a top surface of the integrated component, thereby forming a chamber above the active area. As the electrical and optical routing circuits are embedded within the substrate, bonding of the vacuum vessel to the substrate is simplified.

Accordingly, in one aspect, the present disclosure encompasses an integrated package including: an integrated component having an active area disposed in proximity to a top surface of a substrate; a vacuum vessel including a chamber, wherein the chamber is configured to be disposed above the active area; a first bonding portion disposed between a lower surface of vacuum vessel and a top surface of the substrate; and an opening disposed within the substrate, wherein the opening is configured to provide fluidic communication to the chamber.

In some embodiments, the integrated component further includes an electrical routing circuit and an optical routing circuit, wherein the electrical and optical routing circuits are disposed within the substrate, and wherein the active area is configured to connect with the electrical and optical routing circuits.

In other embodiments, the vacuum vessel further includes a cap portion and a pillar portion, wherein the cap portion and the pillar portion are configured to define the chamber.

In some embodiments, the first bonding portion is disposed peripherally around the active area. In other embodiments, the first bonding portion is disposed between a lower surface of the pillar portion and a top surface of the substrate. In yet other embodiments, the first bonding portion is configured to provide a hermetic seal between the integrated component and the vacuum vessel.

In some embodiments, the integrated package further includes an inner recessed region disposed on the top surface of the substrate. In particular embodiments, the inner recessed region is defined within the chamber and located between the first bonding portion and the active area. In one non-limiting use, such a recessed region can be employed to isolate the active area from any bonding material that could physically flow away from the first bonding portion during sealing processes.

In further embodiments, the integrated package includes an outer recessed region disposed on the top surface of the substrate. In some embodiments, the outer recessed region is defined outside of the chamber and peripherally around the first bonding portion.

In some embodiments, the integrated package further includes a second bonding portion disposed peripherally around the opening, wherein the second bonding portion is disposed between the bottom surface of the integrated component and a surface of a vacuum source, thereby providing a vacuum environment within the chamber.

In some embodiments, the cap portion of the vacuum vessel includes an optically clear material.

In some embodiments, the lower surface of the pillar portion (of the vacuum vessel) includes an annular cross-section. In particular embodiments, the first bonding portion includes an annulus of the solderable material, the adhesive, or the eutectic bonding material.

In other embodiments, the lower surface of the pillar portion (of the vacuum vessel) includes a first adhesion layer. In particular embodiments, a top surface of the integrated component includes a second adhesion layer, and the first bonding portion is disposed between the first and second adhesion layers.

In a second aspect, the present disclosure encompasses a method (e.g., of making an integrated package). In some embodiments, the method includes: providing an integrated component having an active area and an opening disposed within the substrate; aligning a vacuum vessel to a top surface of the integrated component; bonding the vacuum vessel to the top surface of the integrated component; and applying a vacuum source to a bottom surface of the integrated component by way of the opening, thereby providing a vacuum environment within the chamber.

In some embodiments, the integrated component further includes an electrical routing circuit and an optical routing circuit. In particular embodiments, the electrical and optical routing circuits are disposed within the substrate, and the active area is configured to connect with the electrical and optical routing circuits.

In some embodiments, the vacuum vessel includes a cap portion and a pillar portion that are configured to define a chamber. In other embodiments, the chamber is configured to be disposed above the active area of the integrated component and to be in fluidic communication with the opening in the substrate.

In some embodiments, said bonding provides a first bonding portion disposed peripherally around the active area.

In some embodiments, the method include (e.g., prior to said applying the vacuum source): bonding a surface of the vacuum source to the bottom surface of the integrated component. In further embodiments, said bonding the surface of the vacuum source provides a second bonding portion disposed on the bottom surface of the integrated component and further disposed peripherally around the opening.

In other embodiments, the method further includes: providing an electrical input to an electrical connection disposed outside of the chamber, wherein the electrical connection is configured to be electrically connected to the electrical routing circuit. In yet other embodiments, the method further includes: providing an optical input to an optical connection disposed outside of the chamber, wherein the optical connection is configured to be optically connected to the optical routing circuit. Said providing the electrical input and said providing the optical input can be conducted in any order or at the same time, thereby providing an electrical signal and an optical signal to the active area.

In some embodiments, the method further includes (e.g., prior to said bonding the vacuum vessel): applying a first adhesion layer on a lower surface of the pillar portion of the vacuum vessel. In other embodiments, the method further includes: applying a second adhesion layer on the top surface of the integrated component, wherein said bonding the vacuum vessel includes providing the first bonding portion between the first and second adhesion layers.

In any embodiment herein, the electrical routing circuit includes one or more electrical traces, metallization layers, and/or electrical vias.

In any embodiment herein, the package further includes an electrical connection that is electrically connected to the electrical routing circuit. In some embodiments, the electrical connection is disposed outside of the chamber. In other embodiments, the electrical routing circuit includes one or more electrical traces, and the electrical connection includes a bond pad configured to be coupled to an electrical input or an electrical output.

In any embodiment herein, the optical routing circuit includes one or more optical waveguides, optical gratings, optical reflectors, and/or optical vias.

In any embodiment herein, the package further includes an optical connection that is optically connected to the optical routing circuit. In some embodiments, the optical connection is disposed outside of the chamber. In other embodiments, the optical routing component includes one or more optical waveguides, and the optical connection includes a surface or a groove configured to be coupled to an optical input or an optical output.

In any embodiment herein, the active area includes an ion trap, DC and RC electrodes to create an electric potential well, a neutral or ionized atom sensor, a light-emitting diode, a photodetector, a microresonator, an ion source, a light output grating, and/or a vertical cavity surface-emitting laser.

In any embodiment herein, the first bonding portion includes a solderable material, an adhesive, an epoxy, or a eutectic bonding material (e.g., any described herein). Additional details follow.

Definitions

As used herein, the term "about" means+/−10% of any recited value. As used herein, this term modifies any recited value, range of values, or endpoints of one or more ranges.

By an "electrical connection" or related word forms is meant any pathway in which an electrical signal may be transmitted or received. Such a pathway may include air, a metal, a conductive material, and the like.

By "fluidic communication," as used herein, refers to any duct, channel, tube, pipe, chamber, or pathway through which a substance, such as a liquid, gas, or solid may pass substantially unrestricted when the pathway is open. When the pathway is closed, the substance is substantially restricted from passing through. Typically, limited diffusion of a substance through the material of a plate, base, and/or a substrate, which may or may not occur depending on the compositions of the substance and materials, does not constitute fluidic communication.

By an "optical connection" or related word forms is meant any pathway in which an optical signal may be transmitted or received. Such a pathway may include air, a dielectric, a polymer, a semiconductor, and the like.

By "bonding," "attaching," or related word forms is meant any covalent or non-covalent bonding interaction between two components. Non-covalent bonding interactions include, without limitation, hydrogen bonding, ionic interactions, halogen bonding, electrostatic interactions, π bond interactions, hydrophobic interactions, inclusion complexes, clathration, van der Waals interactions, and combinations thereof.

As used herein, the terms "top," "bottom," "upper," "lower," "above," and "below" are used to provide a relative relationship between structures. The use of these terms does not indicate or require that a particular structure must be located at a particular location in the apparatus.

DETAILED DESCRIPTION

Figure 1A:
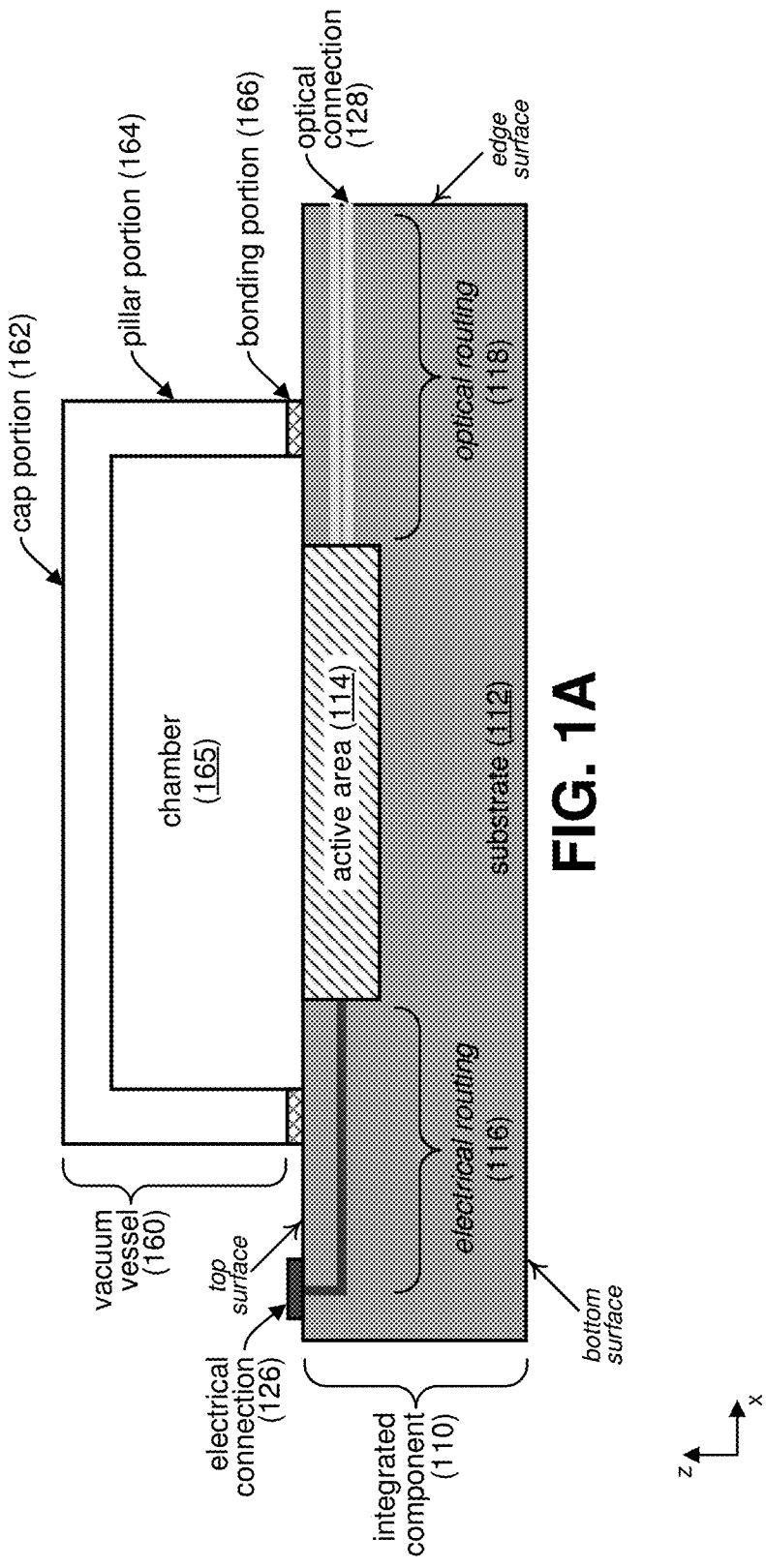
FIG. 1A-1D shows schematics of non-limiting integrated packages. Provided are (A) a cross-sectional view of a non-limiting embodiment having a vacuum vessel 160, an integrated component 110, and a bonding portion 166 disposed therebetween; (B) a cross-sectional view of another non-limiting embodiment having an inner recessed region 111a and an outer recessed region 111b; (C) another cross-sectional view of the package along view/C in FIG. 1B; and (D) yet another cross-sectional view of the package in FIG. 1C bonded to a vacuum source 180.

The present disclosure relates to an integrated package including an integrated component, a vacuum vessel, and a first bonding portion configured to seal the integrated component to the vacuum vessel. The integrated component includes an active area for sensing or detecting an analyte of interest, as well as embedded electrical and optical routing circuits that are connected to the active area. By having embedded circuitry, bonding can be simplified between the integrated component and the vacuum vessel. For example, hermetic bonding can include the use of high temperatures, chemical adhesives, or other methodologies that can damage an underlying routing circuits. Embedded routing circuits can be less prone to damage, while also providing an exposed surface for bonding a vacuum vessel.

In one instance, such an active area can include that for a surface ion trap. Use of the integrated packages described herein can provide a miniaturized trap.

Typically, most surface ion trap experiments are carried out by placing an ion trap device within a large, heavy vacuum chamber. Access through such chambers to the device can be challenging. Electrical signals, such as radiofrequency (RF) and direct current (DC) trapping voltages necessary to perform trapped ion operations, can be provided by way of special feedthrough ports in the vacuum flanges. Optical signals can be passed through vacuum windows. Alternatively, optical signals can be provided by way of optical fibers, which are inserted into a vacuum chamber by way of drilled holes within blank flanges and then sealed into place with epoxy. Such configurations can provide difficulties in detecting optical signals for devices lacking integrated detectors, in which ions may need to pass through the vacuum chamber to external optics that are often several to tens of centimeters away, thereby reducing collection efficiency and increasing crosstalk between ion channels. In contrast, the present disclosure provides an integrated package that improves overall SWaP (size, weight, power), while allowing for operation outside of a static laboratory environment.

There is a need for low SWaP vacuum vessels that can be integrated with an active area. For example, there is an increased interest in using surface trapped ion technology for sensor, clock, and computing applications in dynamic environments, such as in battlefields or on satellite platforms. In one non-limiting embodiment, the present disclosure provides an integrated package for achieving this goal. In another embodiment, the vacuum vessel and integrated component, together, provide a configuration that allows for significantly increased optical access for both delivering and collecting light with external optics, which allows for relaxed mechanical mounting constraints and lower ion channel cross talk.

In particular embodiments, the integrated package includes a functional surface trap and a low SWaP vacuum vessel. Such a package can provide ultra-high vacuum (UHV) performance, even after the vacuum vessel is treated by way of initial conditioning (e.g., to provide an atomic source), baking (e.g., to remove moisture or possible contaminants; or to a temperature of at least 250° C., or preferable 350° C., for an extended period), backfilling (e.g., with a buffer gas), pumping (e.g., to provide a vacuum environment from about $10^{-9}$ to $10^{-11}$ Torr), and sealing (e.g., to bond the package to a vacuum source or a pump, thereby maintaining appropriate vacuum conditions).

FIG. 1A provides a non-limiting integrated package having an integrated component 110, a vacuum vessel 160, and a bonding portion 166 disposed therebetween. As can be seen, the integrated component 110 includes an active area 114 that is disposed within the substrate 112 and yet still accessible by way of a top surface of the substrate 112. The active area 114 includes a region having structures to facilitate detecting or sensing an analyte (e.g., an ion) or an environmental condition (e.g., temperature, radiation condition, etc.). In other embodiments, the active area 114 can include any useful microelectromechanical device or system. Further examples of active areas are described herein.

Electrical and optical signals are provided to the active area by way of electrical and optical routing circuitry, respectively. As seen in FIG. 1A, the integrated component 110 can include electrical routing circuitry 116 and optical routing circuitry 118 disposed within the substrate 112. Non-limiting examples of components within such circuitry include electrical tracing, optical waveguides, as well as others described herein.

Such circuitry can be accessed outside of the active area by way of connections. For instance, as seen in FIG. 1A, an electrical connection 126 and an optical connection 128 can be disposed outside of a chamber 165, which in turn is disposed above the active area 114. In this configuration, such connections provide signal access without breaking the vacuum environment. Such access can include transmitting and receiving signals between the connection and the active area.

Electrical and optical connections can be located on any useful surface of the integrated component. For instance, the electrical connection can be located on a top surface, a bottom surface, or an edge surface of the integrated component, in which such a connection can be a bond pad configured to be coupled to an electrical input/output. Electrical signals can be provided by bonding a wire to the bond pad.

In another instance, the optical connection can be located on a top surface, a bottom surface, or an edge surface of the integrated component, in which such a connection can include a surface or a groove configured to be coupled to an optical input/output. For example, optical connections can be made outside the vacuum vessel, for example by using fiber V-groove arrays in the periphery of the substrate. This approach can eliminate the need for feedthroughs and free-space optics.

The package can further include a vacuum vessel configured to provide a chamber disposed over the active area of the integrated component. As seen in FIG. 1A, the vacuum vessel 160 can include a cap portion 162, a pillar portion 164, and a chamber 165. The cap portion 162 and the pillar portion 164 are configured to define the chamber 165; and the chamber 165, in turn, is configured to be disposed above the active area 114. The pillar portion 164 provides a wall that is peripherally disposed around the active area 114, and a lower surface of the pillar portion 164 is configured to be attached to a top surface of the substrate 112. The upper surface of the pillar portion 164 is configured to be attached to the cap portion 162. The pillar and cap portions can be made of the same material in a monolithic manner or different materials that may be bonded, brazed, or otherwise attached together.

The vacuum vessel can be formed from any useful material. In one instance, the cap portion can be formed of an optically clear material. Such a material can include glass, e.g., borosilicate glass, quartz, and the like. In another instance, both the cap and pillar portions are formed of same or different optically clear materials. Use of an optically clear material can provide optical access to the active area, which in turn could allow for much higher collection efficiency of optical signals from the active area and/or for much tighter optical beam delivery to the active area.

In yet another instance, the cap and pillar portions are formed of materials capable of being directly or indirectly bonded to the substrate of the integrated component. Non-limiting materials can include, e.g., silicon, metal, and the like.

The vacuum vessel can further include any useful shape or configuration. For instance, the vacuum vessel can include a continuous pillar portion that has an annular shape, such as in a cylinder. The cap portion can then have a circular cross-section that is attached to the annular pillar portion. In another instance, the vacuum vessel includes four planar pillar portions and a horizontal cap portion, which can be bonded together to form a rectangular prism A first bonding portion can be present to provide a seal between the vacuum vessel and the integrated component, while disposing the chamber of the vacuum vessel above the active area. As seen in FIG. 1A, the bonding portion 166 can be disposed peripherally around the active area 114. Upon sealing or bonding, the bonding portion 166 is disposed between a lower surface of the pillar portion 164 and a top surface of the substrate 112. Thus, in some embodiments, the pattern of the bonding portion is consistent with the cross-sectional surface provided by the lower surface of the pillar portion that is to be bonded to the top surface of the substrate. For instance, if the pillar portion forms an annular wall having an annular cross-section, then the bonding portion can form an annular pattern that attaches to the lower surface of that annular wall.

The bonding portion can be composed of any useful material to provide a hermetic seal. Such materials can include a solderable material, a metal, an alloy, an adhesive, an epoxy, a polymer, and the like. Yet other non-limiting bonding materials can include a solder (e.g., gold-tin (Au—Sn) solder, gold-tin-copper (Au—Sn—Cu) solder, as well as alloys including any combination of gold (Au), tin (Sn), copper (Cu), nickel (Ni), germanium (Ge), bismuth (Bi), indium (In), and the like); a gold-gold bond; a metal (e.g., titanium (Ti), platinum (Pt), and/or gold (Au)); a eutectic alloy (e.g., alloys including silicon (Si), gold (Au), aluminum (Al), copper (Cu), tin (Sn), and the like); an adhesive, such as an isotropic conductive adhesive (ICA), a non-conductive adhesive (NCA), or an anisotropic conductive adhesive (ACA); an epoxy; a ultraviolet (UV) curable adhesive; and the like.

Sealing or bonding can be achieved by applying a bonding material between the vacuum vessel and the integrated component; and then applying heat, pressure, and/or radiation (e.g., ultraviolet radiation) to provide a bonding portion formed of the bonding material. In some instance, the bonding portion can provide a hermetic seal. Any material used herein can be selected to withstand the presence of such heat and/or pressure. For instance, the materials employed for the cap portion, pillar portion, substrate, active area, and the like can be selected from the group of a semiconductor material, a metal, a dielectric, a polymer, a ceramic, a glass, and the like.

The bonding material can be applied in any useful matter. In one instance, the bonding material can be patterned or plated on the top surface of the substrate and/or a surface disposed on the lower portion of the pillar portion. Application and patterning can depend on the bonding material being employed. For instance, a bonding material can include a metal or a metal alloy that is patterned on a lower surface of the pillar portion and on a top surface of the substrate. Bonding can include aligning the two patterns and then applying pressure, heat, and/or radiation, such as to form a eutectic bond.

Other layers or structures may be present to facilitate such sealing or bonding. For example, the integrated component can include an alignment mark to allow for ease of aligning the vacuum vessel over the active area. To facilitate alignment of the bonding material on the surface of the integrated component, the alignment marker can be patterned on the top surface of the substrate. Such a pattern can be disposed peripherally around the active area. Furthermore, the alignment marker can, in some instances, be formed from a solderable material, a metal, an alloy, an adhesive, an epoxy, a polymer, and the like. The material for the alignment marker can be the same or different from the bonding material used for the bonding portion.

In another embodiment, a top surface of the integrated component can include an adhesion layer that is patterned around the active area. The pattern for the adhesion layer can be such that allows for overlap with a cross-section provided by a lower surface of the pillar portion. After alignment and bonding, the bonding portion can be disposed between the adhesion layer and the pillar portion. Furthermore, the lower surface of the pillar portion can also include an adhesion layer. The adhesion layers can be formed of any material that allows for enhanced bonding to the bonding portion, increased wetting of the bonding material to a surface, and the like. In yet other instances, an adhesion layer is present on both the top surface of the integrated component and the lower surface of the pillar portion.

In one instance, to bond the vacuum vessel to the integrated component, we first patterned the substrate with an annulus of gold over underlying metal adhesion layers. Patterning can include fixturing the substrate prior to aligning with a mask to provide the annulus. Furthermore, masks can be configured to allow for deposition of the gold annulus on the top and bottom of the die to constrain the solder to those regions. In some implementations, the substrate includes the following sequence of metals: titanium, then platinum, and then gold. Each metal layer can, in some instances, be deposited by use of one or more masks. In addition, the vacuum vessel can include an adhesion layer. We also plated the pillar portion of the vacuum vessel (e.g., the rim or lower surface of the pillar portion) with gold. Then, the two gold surfaces can be soldered together. Fixturing can be employed to improve component alignment during soldering.

Figure 1B:
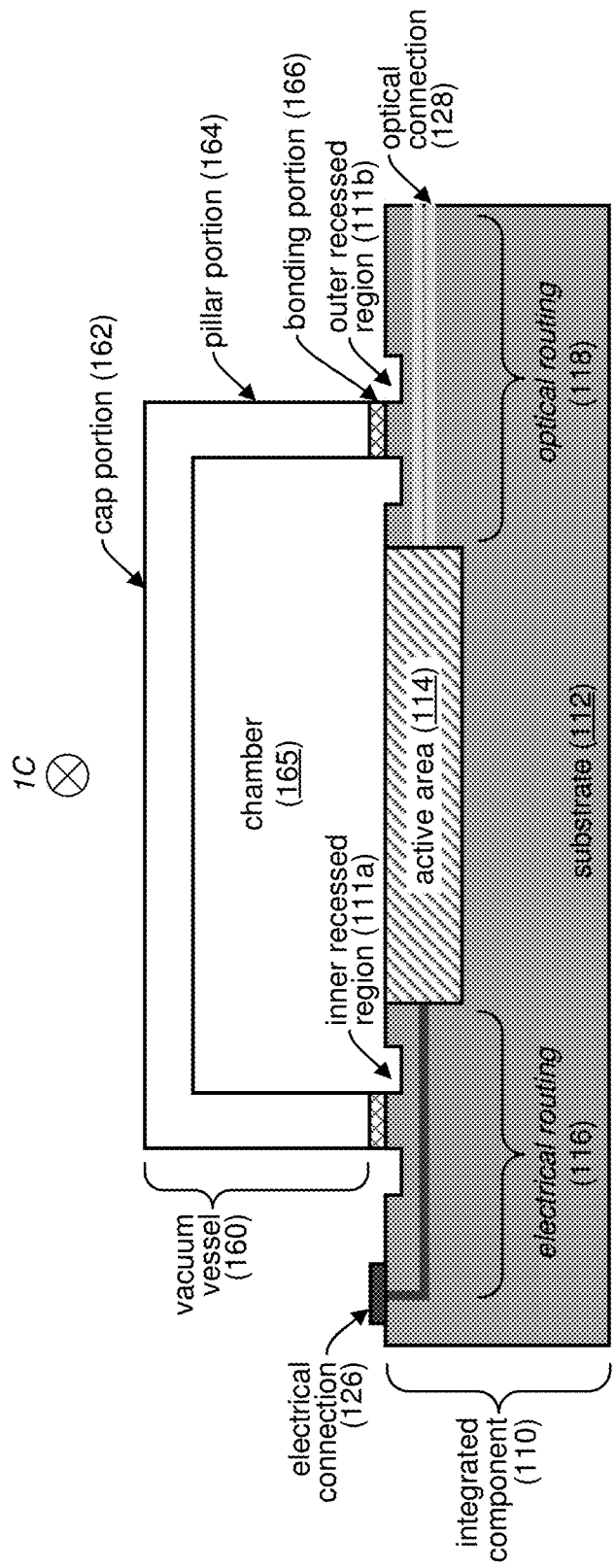

In another instance, such a structure can include a recessed region to minimize uncontrolled spreading of the bonding material during formation of the bonding portion. As seen in FIG. 1B, the integrated component 110 can include an inner recessed region 111*a* disposed on the top surface of the substrate 112. In particular, the inner recessed region 111*a* can be defined such that it is positioned within the chamber 165 after aligning and sealing. For instance, the inner recessed region 111*a* can be located between the site of the first bonding portion 166 and the site of the active area 114. The size and depth of the inner recessed region 111*a* can change, based on the amount, type, and flowability of the bonding material being used within the bonding portion 166. The shape of the inner recessed region can also be consistent with the shape of the pillar portion. For instance, if the pillar portion forms a circular wall, then the inner recessed portion can be a circular groove within the substrate that is encircled by the pillar portion.

The structure can also include a further recessed region. As seen in FIG. 1B, the integrated component 110 can include an outer recessed region 111*b* disposed on the top surface of the substrate 112. The outer recessed region 111*b* can be defined such that it is positioned outside of the chamber 165 after aligning and sealing. For instance, the outer recessed region 111*b* can be located between the site of the first bonding portion 166 and the site of the edge surface of the substrate 112. Again, the size, depth, and shape of the outer recessed region can be adapted to facilitate formation of the bonding portion without interference with other structures disposed on the top surface of the integrated component.

Figure 1C:
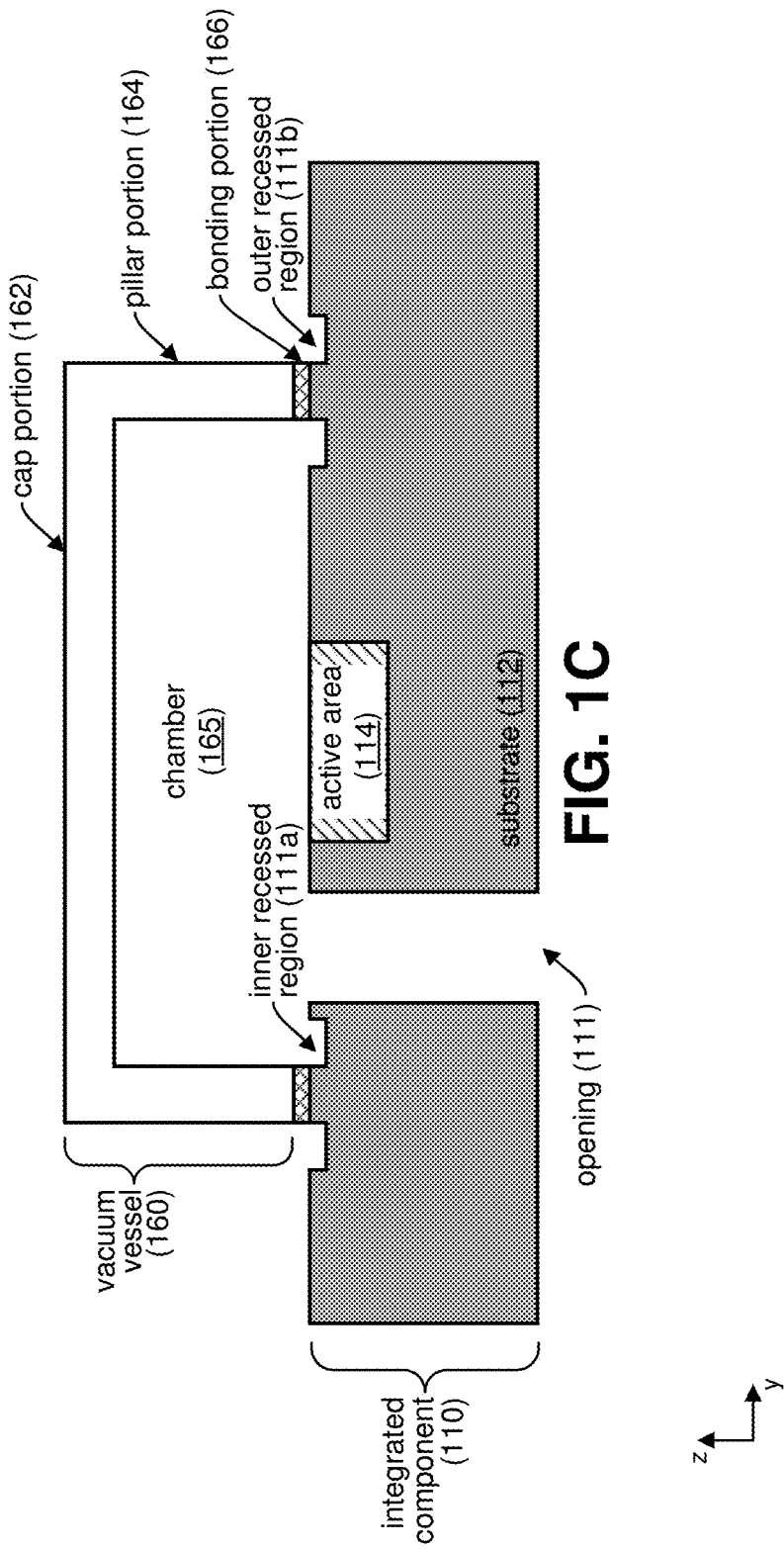

The package can include an opening that allows for filling, evacuating, or pressurizing the chamber. For instance, as seen in FIG. 1C, the opening 111 can be disposed within the substrate 112 and can be configured to provide fluidic communication to the chamber 165. In this way, the environmental condition within the chamber 165 may be modified or maintained, as desired. In particular embodiments, the opening is located within the substrate to provide fluidic communication to the chamber, while not interfering with the active area or the routing circuitry present within the substrate.

The chamber can be modified by performing one or more initial conditioning or baking operations. Such operations can include introducing a source gas or a buffer gas into the chamber; baking at elevated temperatures to remove contaminants or moisture; or flushing the chamber with a gas.

Figure 1D:
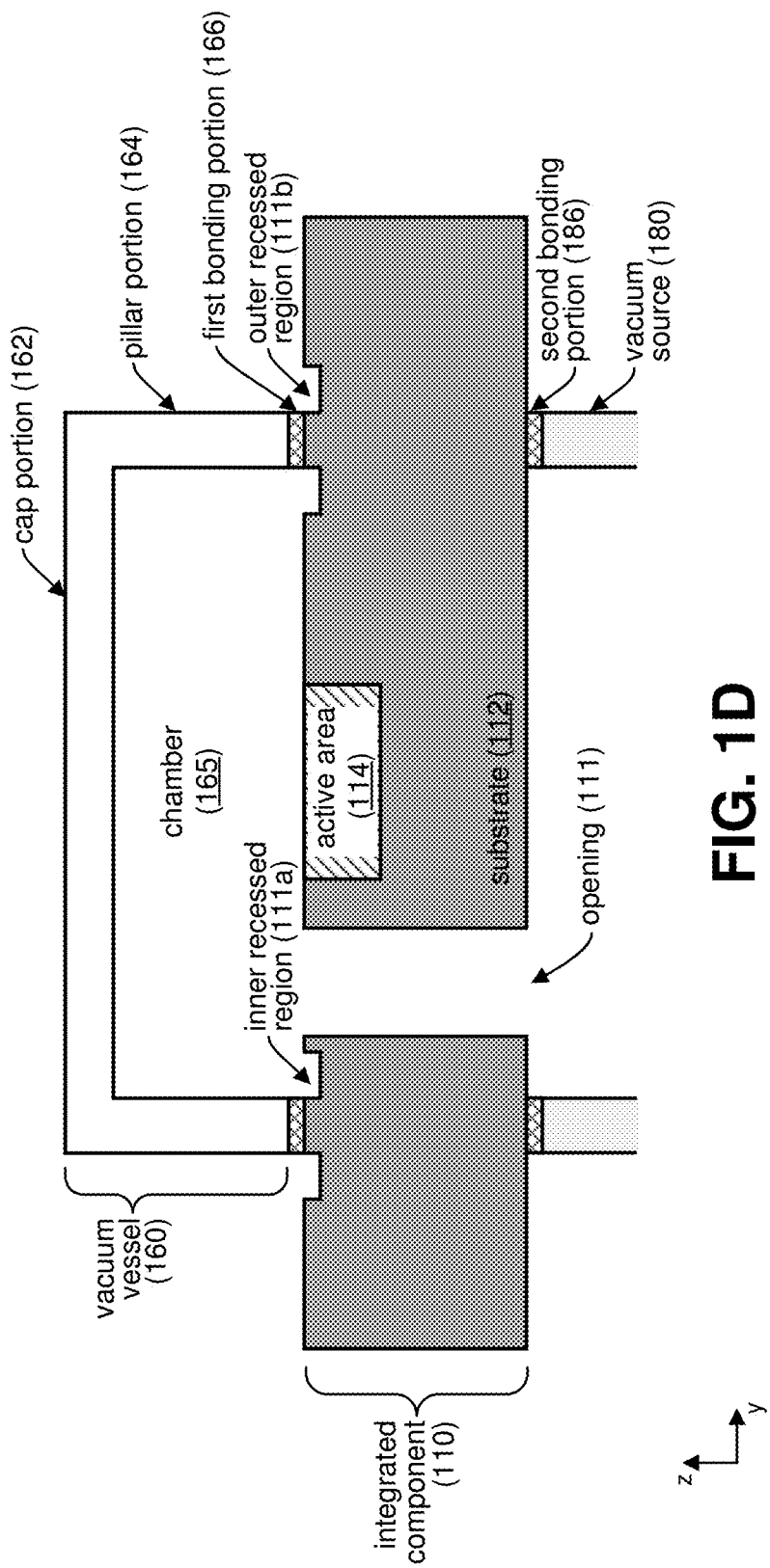

The chamber can be modified by applying a vacuum. In certain instances, a vacuum source can be bonded or attached to the integrated component to maintain a vacuum environment. As seen in FIG. 1D, the integrated package can include a second bonding portion 186 disposed peripherally around the opening 111. In one instance, the second bonding portion 186 is disposed between the bottom surface of the integrated component 110 and a surface of a vacuum source 180, thereby providing a vacuum environment within the chamber 165.

To maintain a background gas pressure at the desired level, the ultra-high vacuum (UHV) packaging can include appropriate pumping for the gas loads that arise within the system and that permeate through the vacuum system walls. Active pumping can be desirable for management of helium and other noble gases, which passive pumping cannot manage effectively. Remaining gas loads can be managed with bulk non-evaporable getter pumps.

Figure 2:
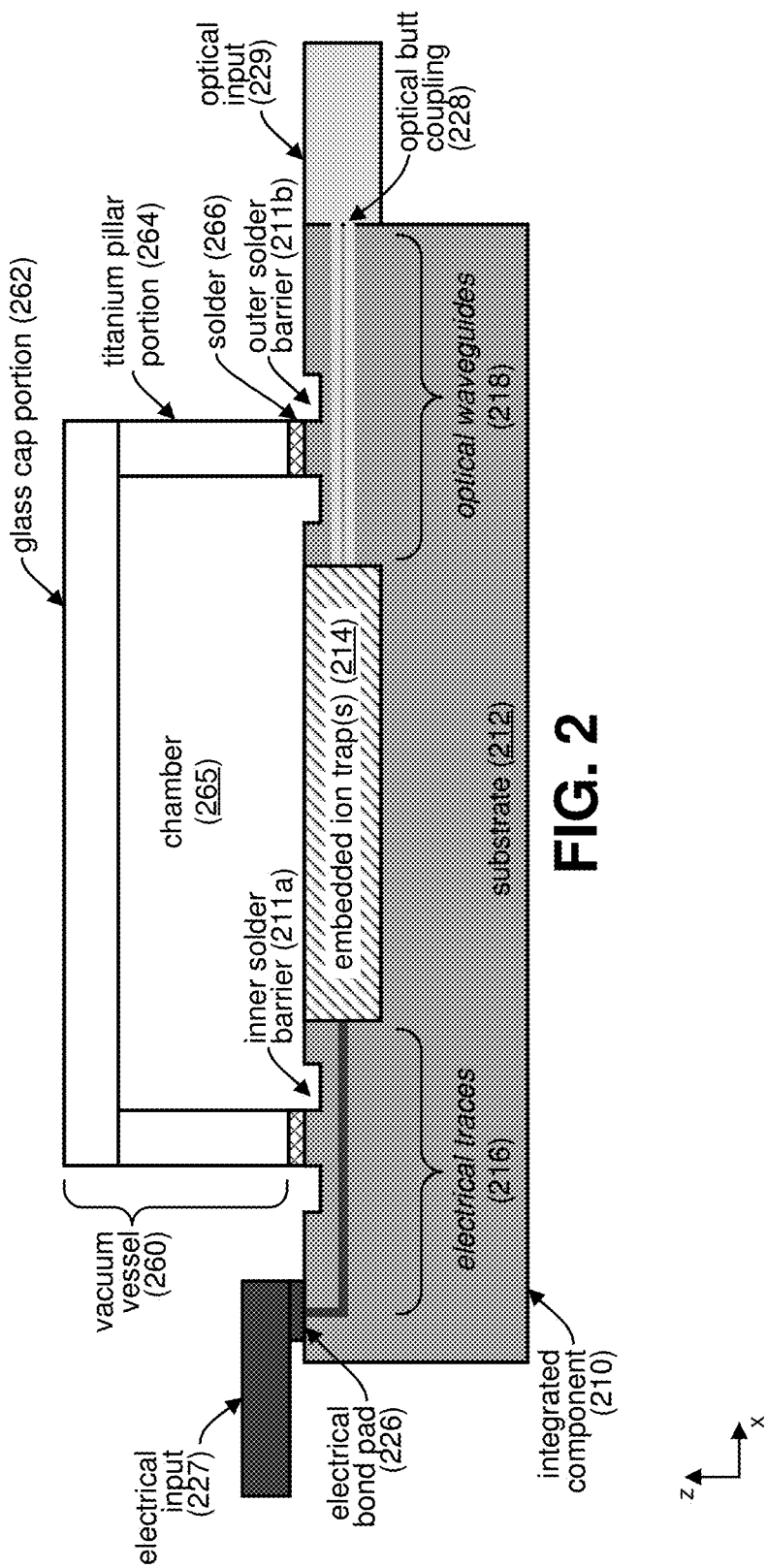
FIG. 2 shows a schematic of another non-limiting integrated package.

Upon maintaining a vacuum environment in the chamber, the integrated package can be electrically and optically connected to input and output sources. For instance, an electrical input or output can be connected to an electrical connector, and an optical input or output can be connected to an optical connector. As seen in FIG. 2, a non-limiting integrated package can include an integrated component 210 having electrical traces 216 and optical waveguides 218 embedded within a substrate 212. Electrical traces 216 can be connected by way of an electrical bond pad 226 to an electrical input 227; and optical waveguides 218 can be connected by way of optical butt coupling 228 to an optical input 229.

An active area including embedded ion traps 214 can be disposed in proximity to a top surface of the substrate 212. Furthermore, such embedded ion traps 214 can be connected to the electrical traces 216 and optical waveguides 218, thereby providing electrical and optical signals to and from the active area.

A vacuum vessel can include any component(s) to provide a vacuum environment in proximity to the active area. In one instance, as seen in FIG. 2, the vacuum vessel 260 can include a titanium pillar portion 264 and a glass cap portion 262 attached to an upper surface of the pillar portion 264. The vacuum vessel 260 can be bonded to the top surface of the substrate 212 by way of a bonding portion that includes solder 266. The type and treatment of solder can be optimized to provide a seal between the titanium pillar portion 264 and the substrate 212. Furthermore, the substrate 212 can be patterned with an inner solder barrier 211*a* disposed within the chamber 265 and an outer solder barrier 211*b* disposed outside of the chamber 265.

In one instance, the solder is composed of gold and tin. Non-limiting solder compositions include $Au_{80}Sn_{20}$ (80 wt. % Au and 20 wt. % Sn), $Au_{78}Sn_{22}$ (78 wt. % Au and 22 wt. % Sn), $Au_{10}Sn_{90}$ (10 wt. % Au and 90 wt. % Sn), alloys thereof, and the like (e.g., any solder having a melting temperature from about 200 to 300° C., such as about 280° C.). Yet other solders include those having a processing temperature from about 250 to 400° C. (e.g., from about 300 to 350° C., such as about 330° C.) and having any useful processing pressure (e.g., ambient pressure). The solder can be provided as a paste or as a preform (e.g., a stamped perform) having any useful thickness (e.g., from about 0.0002 to 0.004 inches; or from about 5 to 200 μm). Before, during, or after providing the solder, one or more agents (e.g., acids, such as formic acid or a forming gas including a mixture of hydrogen and nitrogen) can be used to reduce oxide formation.

Figure 3A:
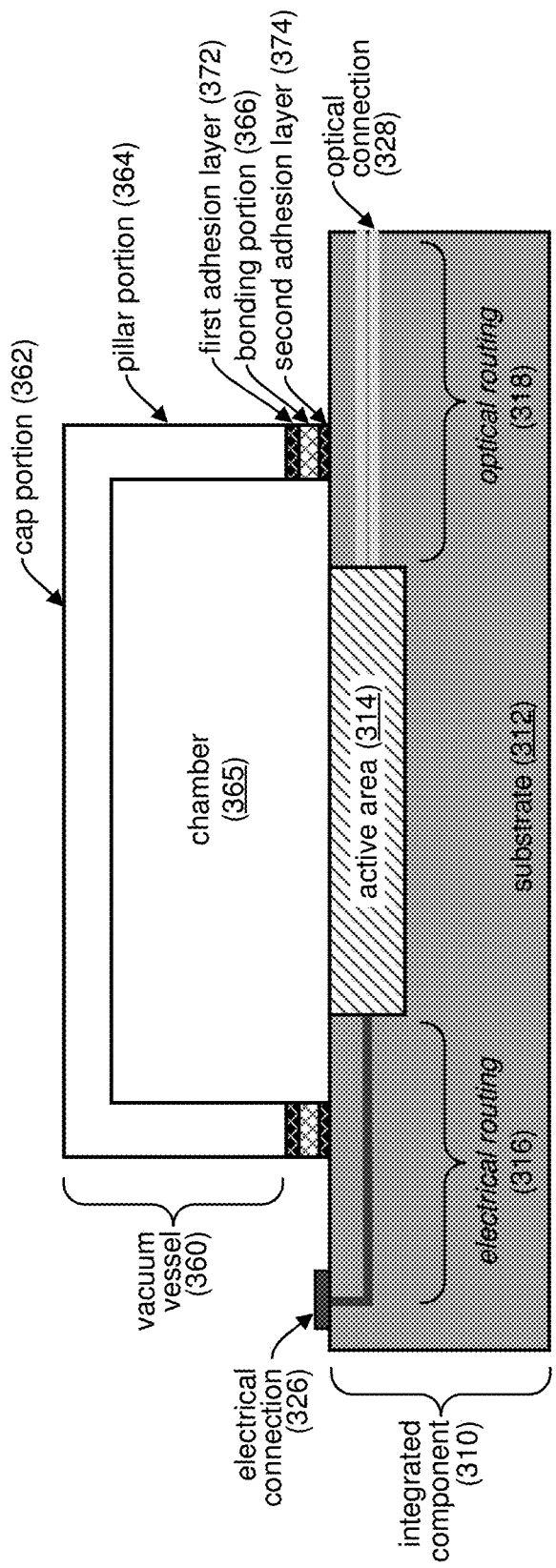
FIG. 3A-3D shows schematics of yet other non-limiting integrated packages. Provided are (A) a cross-sectional view of a non-limiting embodiment having a first adhesion layer 372, a second adhesion layer 374, and a bonding portion 366 disposed therebetween; (B) an exploded view of the package in FIG. 3A; (C) an exploded view of another package; and (D) a plan view of yet another non-limiting package.

As described herein, one or more adhesion layers may be present to facilitate sealing or bonding. As seen in FIG. 3A, the package can include an integrated component 310 having electrical routing circuitry 316 and optical routing circuitry 318 embedded within the substrate 312. Access to such circuitry can include the use of electrical and optical connections 326, 328. An active area 314 can be disposed on a top surface of the substrate 312, and a vacuum vessel 360 can be bonded to the substrate 312 to form a chamber 365. As can be seen, sealing between the integrated component 310 and the vacuum vessel 360 includes the use of a first adhesion layer 372, a second adhesion layer 374, and a bonding portion 366 disposed therebetween.

The adhesion layers can be provided in any useful manner. In one instance, the adhesion layers are patterned on to a surface of the pillar portion, the bonding portion, or the substrate. Alternatively, such adhesion layers can include an adhesive disposed on a liner material, which can be used to transport and affix the adhesive. The liner may then be removed. The adhesion layer may also serve as an alignment mark, which provides regions in which a bonding material should be applied. The material for the adhesion layer can be the same or different from the bonding material used for the bonding portion.

Figure 3B:
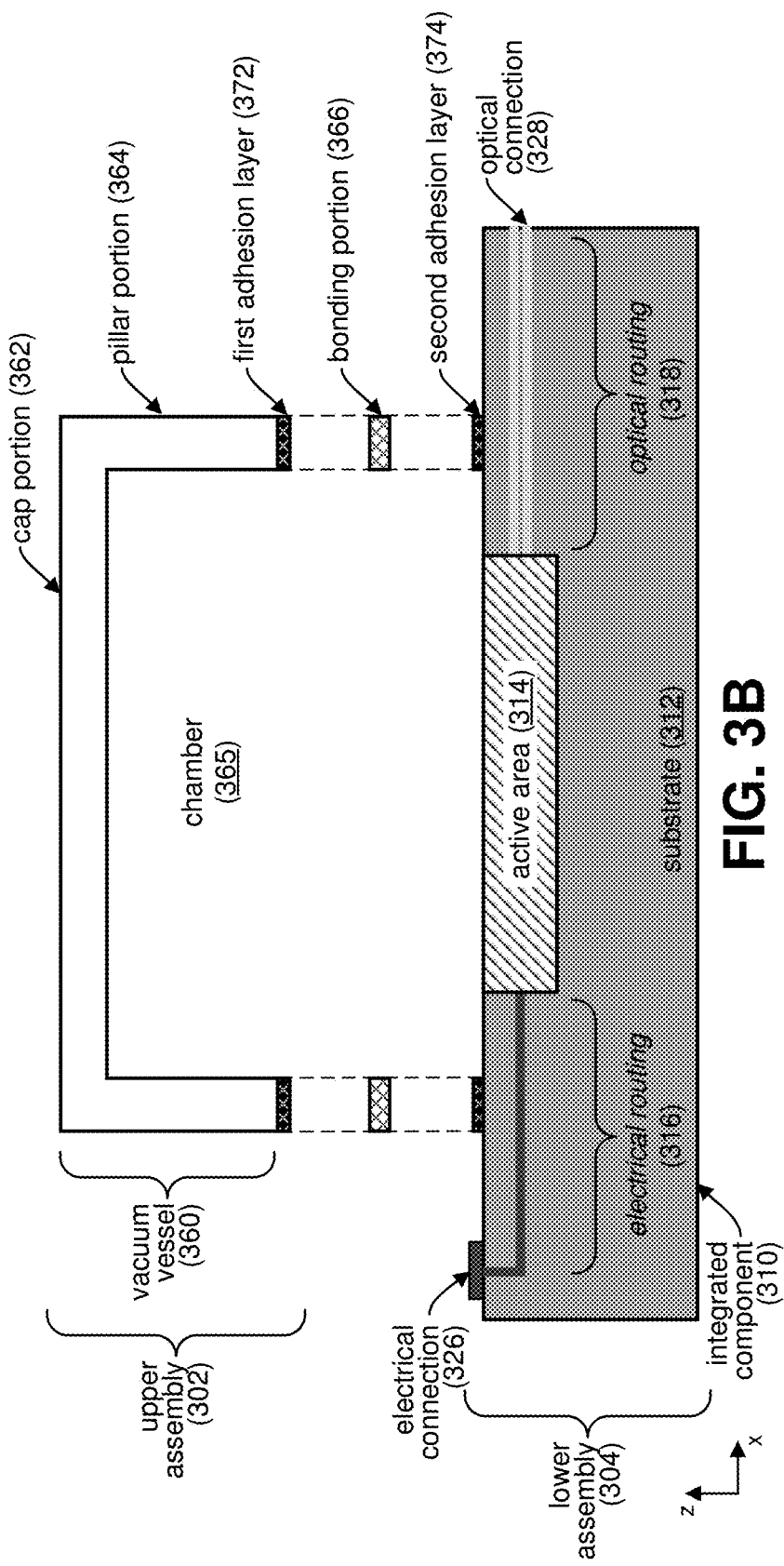

FIG. 3B shows a non-limiting embodiment, in which a package includes an upper assembly 302 and a lower assembly 304. The upper assembly 302 is configured to include the vacuum vessel, and the first adhesion layer 372 is provided on a lower surface of the pillar portion 364. The lower assembly 304 is configured to include the integrated component 310, and the second adhesion layer 374 is provided on a top surface of the substrate 312.

Figure 3C:
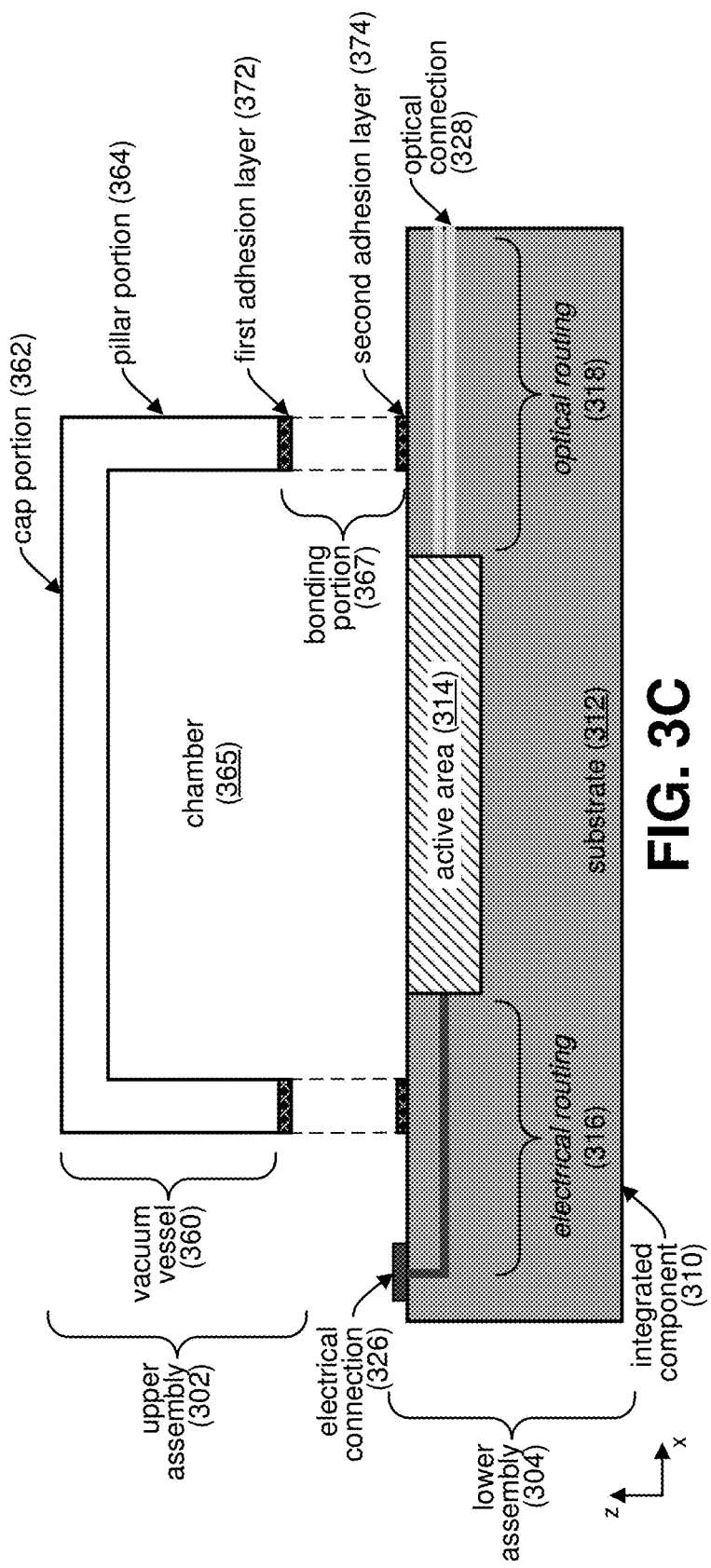

For bonding, the upper assembly 302 and the lower assembly 304 can be aligned, e.g., by using the adhesion layers 372, 374 as alignment marks. Then, the upper assembly 302 and the lower assembly 304 can be bonded. Optionally, a bonding portion 366 can be provided between the upper assembly 302 and the lower assembly 304. In another embodiment, as seen in FIG. 3C, a bonding portion 367 is formed by contacting the first adhesion layer 372 with the second adhesion layer 374. Thus, as can be seen, only an adhesion layer can be employed to provide a bonding portion, or a bonding portion can be provided separately from an adhesion layer.

Figure 3D:
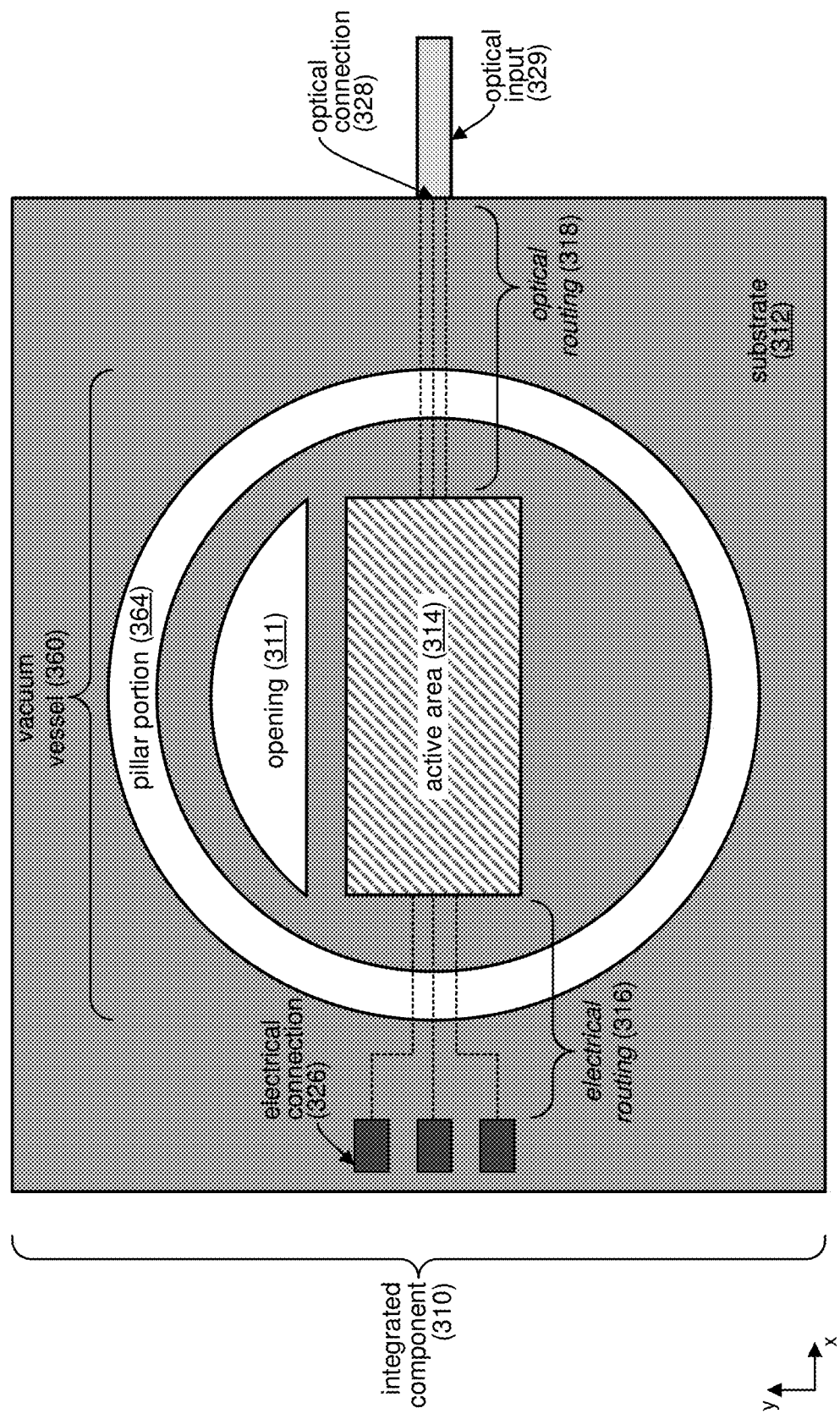

FIG. 3D shows a plan view of a non-limiting package. As can be seen, the package includes an integrated component 310 having electrical and optical routing circuits 316, 318 that are disposed within the substrate 312. Electrical and optical connections 326, 328 are disposed outside of the chamber and outside of the vacuum vessel 360. A pillar portion 364 having an annular wall is more clearly seen, and the opening 311 is disposed within the substrate 312 and extends between the top and bottom surfaces of the substrate 312. The opening 311 is configured to be located outside of the active area 314 and outside of the regions including routing circuitry 316, 318. Other configurations can be employed to capture such embodiments.

Figure 4:
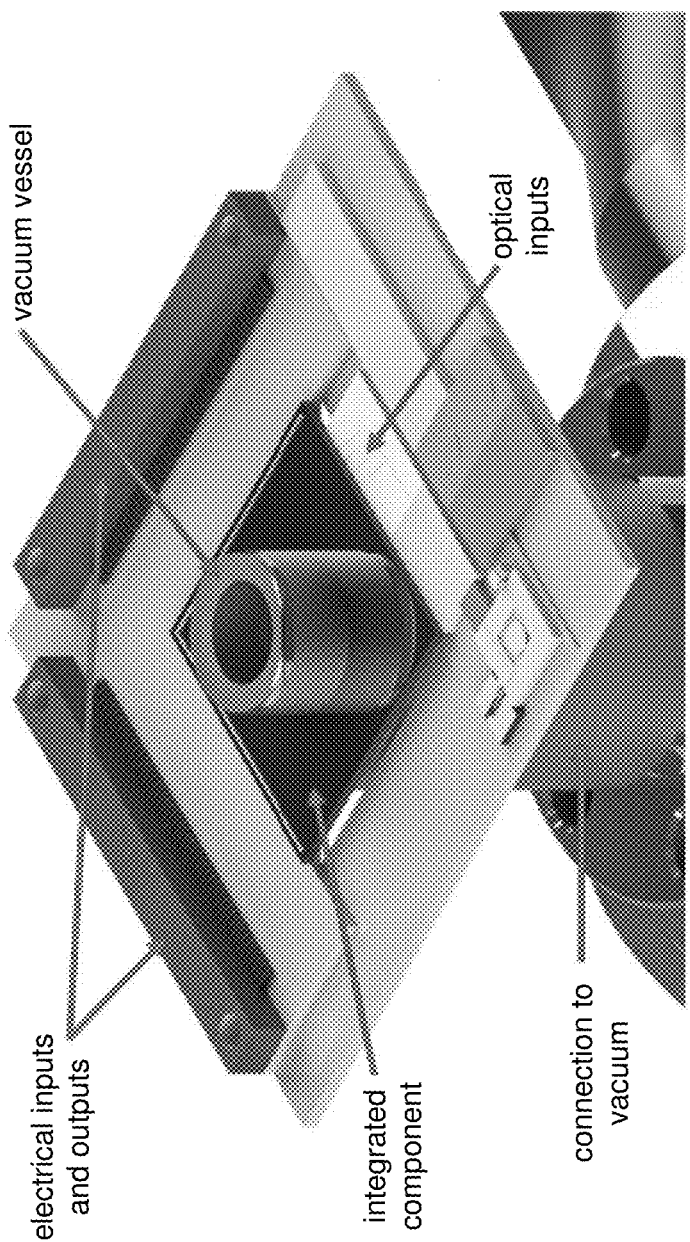
FIG. 4 shows a schematic of a non-limiting vacuum vessel bonded to an integrated component. Also provided are electrical and optical inputs and outputs, as well as a connection to a small vacuum source.

The integrated package may be bonded to a vacuum source (see, e.g., FIG. 1D). Furthermore, FIG. 4 shows another embodiment in which a vacuum vessel is bonded to an integrated component, which in turn includes connections to electrical and optical inputs and outputs (I/O). In this configuration, the package provides integrated detection, all on one common platform. Mechanically, the vacuum vessel includes a chamber defined by the annular walls, top optical window, and top surface of the integrated component. The chamber can provide any useful working volume, such as a milliliter volume range or less. The vacuum vessel can be bonded to the surface of the integrated component in such a manner as to allow for UHV performance. Generally, the chamber can be in fluidic communication with a vacuum source. When the active area is a surface trap, an opening to the chamber can allow for a compact ion pump to be attached for continual pumping, e.g., as needed to maintain a desired vacuum condition. In one instance, a bottom surface of the integrated component having the surface trap can be bonded to a vacuum source (e.g., such as by way of a nipple that connects to the ion pump).

Figure 5A:
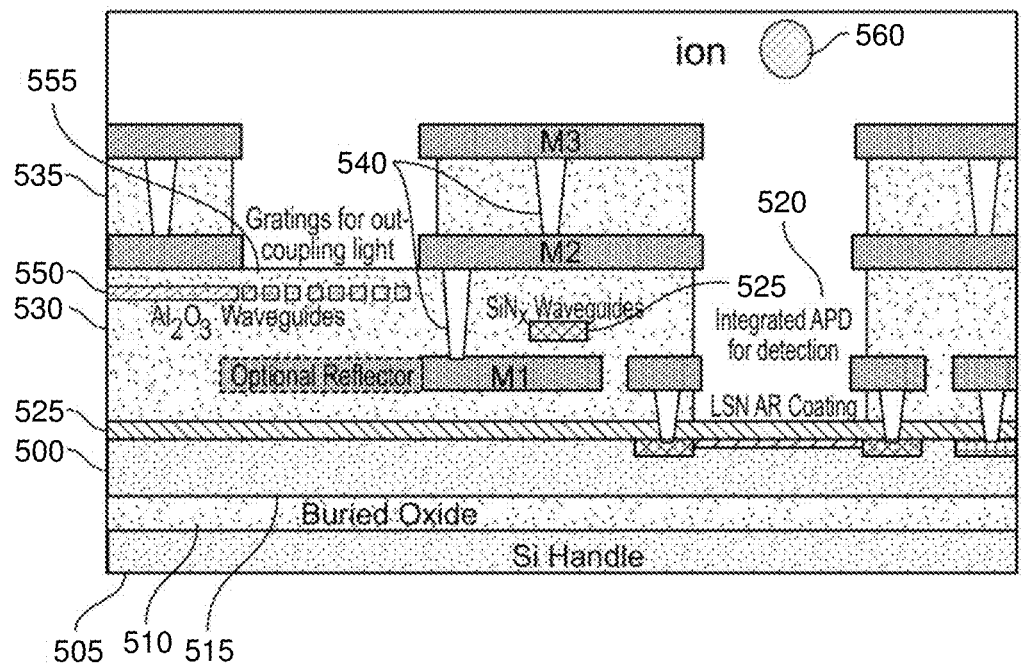
FIG. 5A-5B shows schematics of non-limiting active areas. Provided are schematics of (A) a non-limiting surface ion trap; and (B) a non-limiting single-photon avalanche detector (SPAD).
Figure 5B:
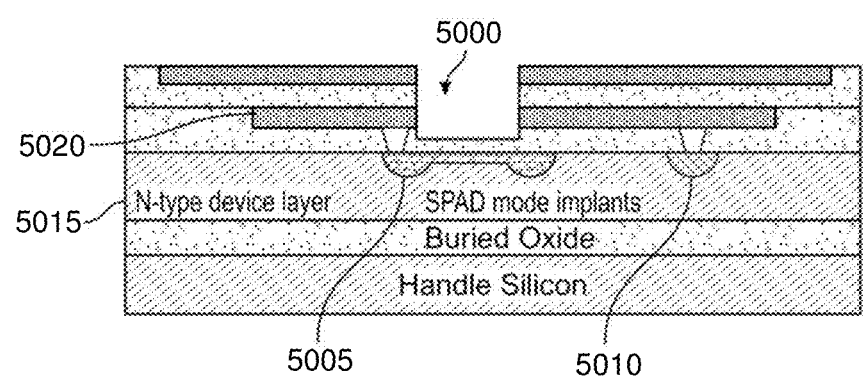

FIG. 5A-5B provides non-limiting embodiments of structures that can be present within an active area.

In one instance, the active area can include a surface ion trap. FIG. 5A is a schematic cross-sectional view of a trap design in an example embodiment. As seen in the figure, a silicon on insulator (SOI) substrate 500 includes a silicon handle layer 505, a buried oxide layer 510, and a silicon device layer 515 in which a monolithically integrated photodetector 520 is shown. An optional antireflection (AR) layer 525 of low-stress silicon nitride (LSN) overlies the photodetector. Three layers of metallization, respectively labeled M1, M2, and M3 are shown, with levels 530, 535 of intermetal dielectric of silicon oxide between them. The metal layers are interconnected by metal vias 540.

Waveguides are embedded at two levels within the intermetal dielectric between M1 and M2. Silicon nitride waveguides 545 are at one level, and alumina waveguides 550 are at the other level. As shown in the figure for the alumina waveguide, gratings 555 formed at the output ends of the waveguides out-couple light into beams directed at the trapping site where trapped ion 560 is shown. With further reference to the drawing, it will be seen that the trapped ion is confined at a height above the top metal M3, and that there is a direct, vertical line of sight from the trapped ion to the photodetector.

In another instance, the active area can include a single-photon avalanche detector (SPAD). A monolithic concept of such a detector is shown in FIG. 5B, where the SPAD 5000 is located in the center of the trap. The doping implants 5005, 5010 required to implement SPADs are processed directly into the silicon device layer 5015 of the ion trap, and the first level 5020 of metal is used to route SPAD signals.

In use, photons can be absorbed within about 50 nm from the front surface of the SPAD, generating electron-hole pairs within the p-type anode implant. Good passivation is required to prevent carrier recombination at the surface, so that the photogenerated electrons are able to drift into the high-field avalanche region and initiate a sustained carrier avalanche for Geiger-mode detection.

Figure 6:
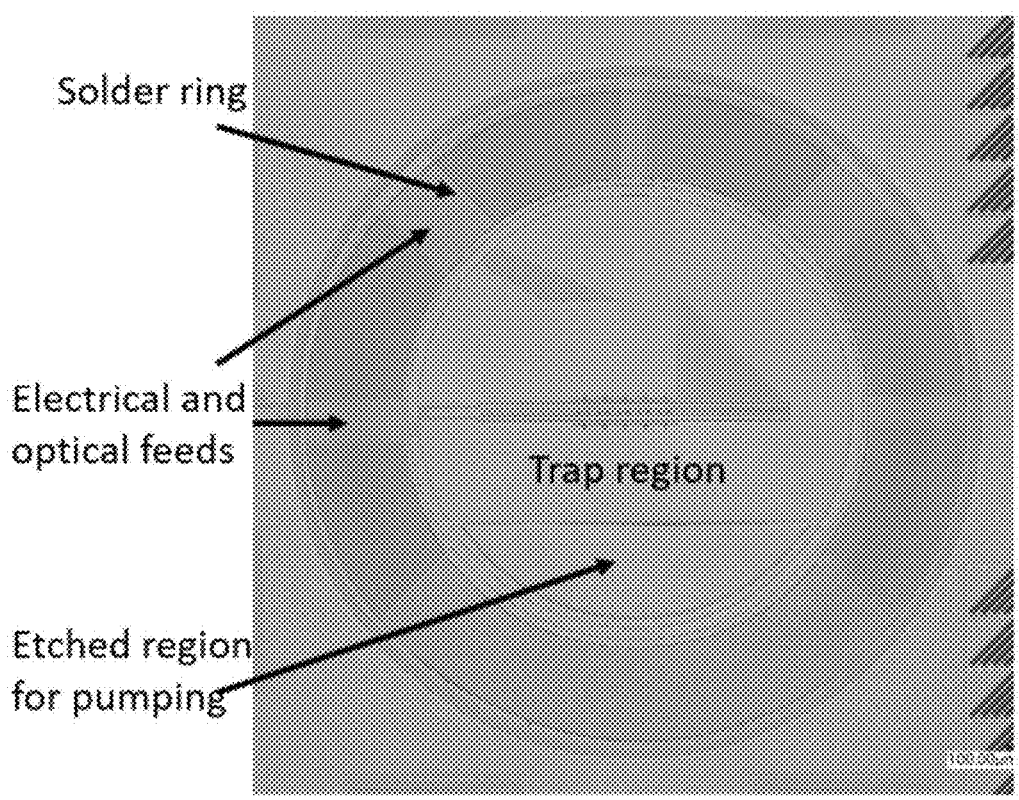
FIG. 6 shows an image of a non-limiting surface ion trap region, which includes a gold-plated annulus (or solder ring) as an adhesion layer for bonding to a vacuum vessel. Also shown are an etched region, which can be removed to serve as an opening through which vacuum may be applied; and a region through which electrical and optical feeds may be embedded within the substrate.

In yet another instance, the active area includes a trap region, and a solder ring can be disposed around the active area. FIG. 6 shows an example of a surface trap having a solder ring that is used to bond a vacuum vessel. All electrical and optical I/O are routed to the trap ions through electrical traces and optical waveguides, which were fabricated under the top surface of the trap and within the substrate. Such a configuration eliminates the need for bulky vacuum feedthroughs or development of UHV compatible optical fiber packaging. In this instantiation, a gold tin solder can be used to create a hermetic seal between the components. Furthermore, a lower surface of the vacuum vessel (e.g., on a surface of the pillar portion) can be coated with gold so that the solder can wet that adhesion surface. When the solder wets the gold annulus patterned on the surface of the integrated component having the ion trap chip, a hermetic seal is created between the vacuum vessel and the substrate, thereby providing an ion trap within a sealed chamber.

The active area of ion trap can be fabricated on the surface of a substrate (e.g., silicon), in which this active area is located inside the annulus. Then, a vacuum opening can be etched through the silicon substrate. The ion trap and the vacuum opening can be integrated into the same lithography process. For instance, various structural components of the ion trap and vacuum opening can be photolithographically defined, and then an etching operation (e.g., a deep silicon etch) can be performed to open up features within the ion trap and to define the vacuum opening.

The bottom surface of the substrate can also include an adhesion layer or a further bonding portion (e.g., which can also be a gold annulus), in which a coated custom vacuum flange (e.g., a gold coated flange) can be attached by way of a bonding portion (e.g., by providing a solderable material to form a seal). In this way, a hermetic seal can be created between a bottom surface of the substrate and a vacuum source. After the standard baking and conditioning operations, this vacuum chamber can be achieved having UHV pressures on the order of about $2\times10^{-11}$ Torr.

Methods of Making an Integrated Package

The present disclosure also encompasses methods of making an integrated package, such as any package described herein. In one instance, the method can include providing an integrated component, aligning a vacuum vessel to a top surface of the integrated component, bonding the vacuum vessel to the integrated component by providing a first bonding portion, and applying vacuum by way of an opening. In this way, the method can be used to provide a vacuum chamber disposed above an active area of the integrated component.

In particular embodiments, the method can further include bonding a surface of the vacuum source to a bottom surface of the integrated component. In this way, a vacuum environment may be maintained by pumping the chamber.

In yet other embodiment, the method can further include providing electrical and/or optical inputs to a connection that is disposed outside of the vacuum vessel. Such connections can be electrically connected to an embedded electric routing circuit within the integrated component, as well as optically connected to an embedded optical routing circuit within the integrated component.

Such methods can include one or more bonding operations, such as to bond the vacuum vessel to a top surface of the integrated component or to bond a vacuum source to a bottom surface of the integrated component. Such operations can include the use of a bonding material (e.g., disposed between the components), an adhesion layer (e.g., disposed on a surface of a component), or a combination thereof. Examples of materials for bonding materials and adhesion layers include, e.g., a solder, a metal, an alloy, an adhesive, an epoxy, and the like. Bonding can include applying pressure, applying heat, applying radiation (e.g., UV radiation), providing a bonding material, as well as combinations thereof.

Figure 7:
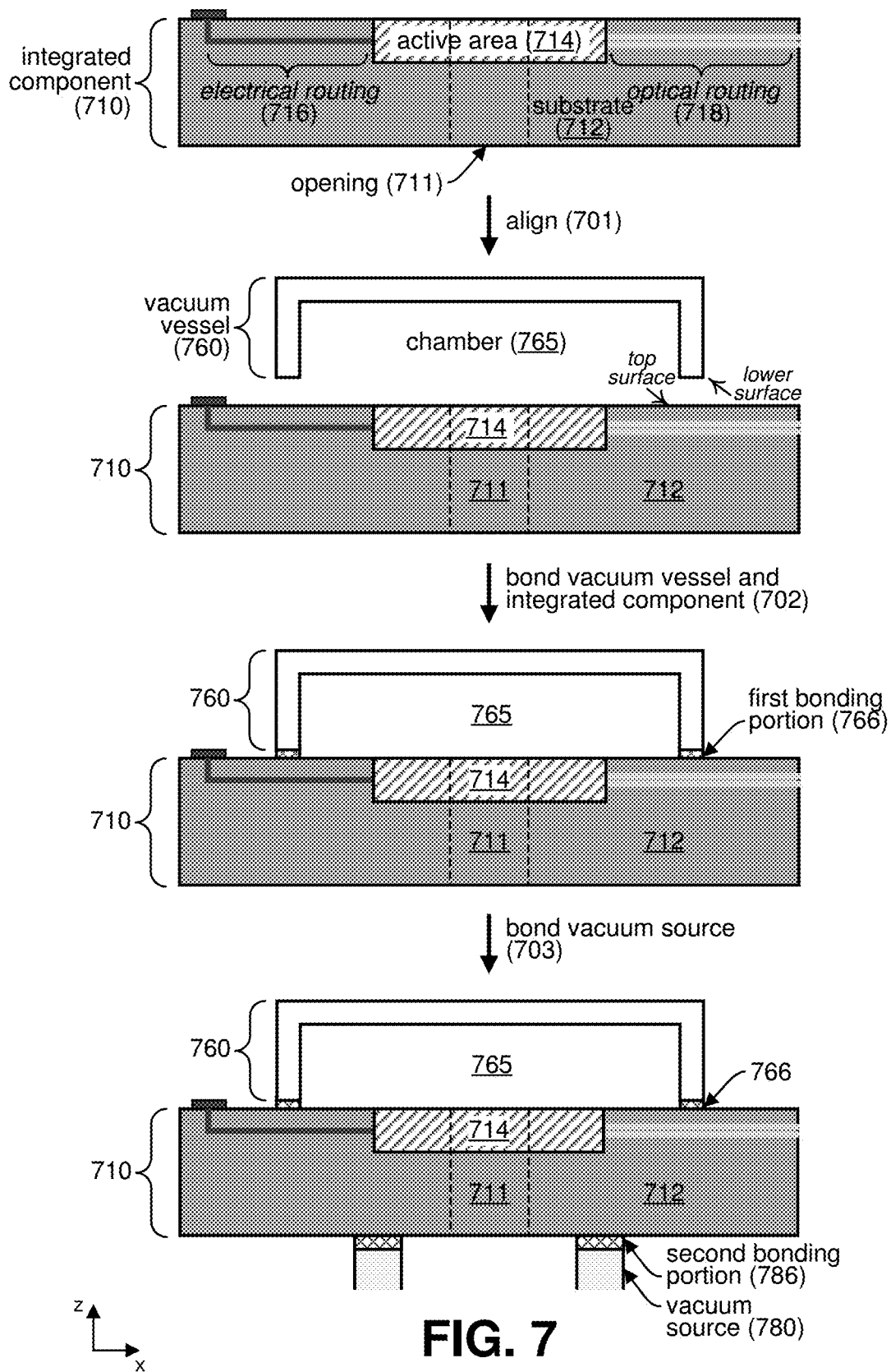
FIG. 7 shows a schematic of a non-limiting method of making an integrated package.

FIG. 7 shows a schematic of a non-limiting method of making an integrated package. As can be seen, the method can include providing an integrated component 710 (e.g., any described herein); aligning 701 the integrated component 710 with a vacuum vessel 760; bonding 702 the vacuum vessel 760 to a top surface of the integrated component 710; and bonding a vacuum source 780 to a bottom surface of the integrated component 710. In particular embodiments, the vacuum source is not bonded but merely applied to an opening in fluidic communication with the chamber. In other embodiments, the vacuum source is bonded and then used to provide a vacuum within the chamber. In yet other embodiments, the method includes first bonding the vacuum source and then bonding the vacuum vessel to the integrated component.

As seen in FIG. 7, the integrated component 710 can include embedded electrical routing circuitry 716, embedded optical routing circuitry 718, and an active area 714 disposed on a top surface of the substrate 712. Also provided is an opening 711, which extends through the top and bottom surface of the substrate but does not interfere with the active area 714, the electrical routing circuitry 716, or the optical routing circuitry 718. In FIG. 7, the opening 711 is indicated with dashed lines to show that the opening is present in another plane that is different than that provided as a cross-sectional view of the active area 714.

Aligning 701 the vacuum vessel can include ensuring that the chamber is disposed above the active area. For instance, as shown in FIG. 7, the vacuum vessel 760 can include a cap portion and a pillar portion that defines a chamber 765 therein. Alignment of the vacuum vessel 760 can include configuring the chamber 765 to be disposed above the active area 714. To provide access to the chamber environment, alignment can also include ensuring that the chamber 765 is disposed above the opening 711. In this way, backside access to the substrate of the integrated component can provide access to the chamber environment.

Bonding 702 of the vacuum vessel can include contacting a lower surface of the vacuum vessel 760 (e.g., a lower surface of a pillar portion) to a top surface of the substrate 712. Bonding can first include applying a bonding material, an adhesive, a metal, a metal alloy, a polymer, and the like; following by contacting the surfaces to be bonded, thereby forming a first bonding portion 766. In some instances, the bonding material (e.g., a solder) can be applied during bonding. In other instances, the vacuum vessel and/or the integrated component can include a bonding material patterned on a surface, such that bonding requires only contacting such surfaces to form the first bonding portion 766. Contact can include applying pressure, heat, radiation, or any combination of these.

Bonding 703 the vacuum source can be useful for maintaining a vacuum environment within a chamber 765. Alternatively, bonding may merely include attaching a vacuum source, thereby allowing that source to be applied to provide a vacuum environment within the chamber. To provide a vacuum to the chamber, the vacuum source can be aligned to be in fluidic communication with the opening 711 extending through the substrate 712 and connected to the chamber 765. Bonding can include applying a bonding material, an adhesive, a metal, a metal alloy, a polymer, and the like, to a bottom surface of the substrate 712 and optionally to a surface of the vacuum source 780. This can be followed by contacting the surfaces to be bonded, thereby forming a second bonding portion 786.

In other instances, the vacuum source and/or the integrated component can include a bonding material patterned on a surface, such that bonding requires only contacting such surfaces to form the second bonding portion 786. Contact can include applying pressure, heat, radiation, or any combination thereof. Any portion of the vacuum source can be bonded to the integrated component, such as a flange, a valve, a nipple, and the like.

Further operations can include pumping gases into or out of the chamber, as well as baking the integrated component and/or the vacuum vessel to remove contaminants. In particular embodiments, an operation can include initial conditioning (e.g., to provide an atomic source), baking (e.g., to remove possible contaminants, such as at a temperature of least 250° C., preferable 350° C., for an extended period), optional backfilling (e.g., with a helium buffer gas), and sealing the package.

Yet other operations can include providing electrical and/or optical inputs or outputs to the active area, such as by connecting an electrical input to an electrical connection that is connected to embedded electrical routing circuitry, as well as by connecting an optical input to an optical connection that is connected to embedded optical routing circuitry.

Additional details regarding various components of the integrated package are described as follows.

Routing of Signals

The integrated package can include any useful circuitry to route signals to and from the active device within a chamber. Such signals can include electrical and optical signals, which are transmitted to and from embedded circuitry within a substrate of the integrated component. In one instance, routing circuitry can include elements that are favored for monolithic integration within a substrate. In another instance, the routing circuitry includes multilevel layers of electronic elements (e.g., buried traces) with dielectric layers disposed therein, as well as multilevel layers of optical elements (e.g., waveguides) disposed within the intermetal dielectric layers.

To access electrical and optical signals outside of the vacuum vessel, externally accessible connections can be electrically or optically connected to embedded circuitry. In this way, electrical and optical connections are external to the vacuum, so as to eliminate the need for feedthroughs and free-space optics.

In one example, electrical signals can be delivered to the active area by wirebonding to bond pads on the surface of the substrate. Vias can be used for vertical interconnections, such as those between bond pads and buried traces or between traces that are buried at different metallization levels. In one example, multiple metallization levels are employed to facilitate electrical routing. By using vertical and horizontal circuitry elements, a large number of electrical signals can be routed beneath the vacuum chamber for communication between the interior and the exterior of the vacuum chamber, without using any feedthroughs. On the exterior of the vacuum chamber, we can readily fanout the various electrical signals to convenient connection points on an interposer chip or the like. An interposer chip, while not required, could be employed to add additional components for filtering, to provide precise mounting areas for the attachment of waveguides, and for providing flexibility for rerouting of electrical lines. Alternatively, the trap chip can be employed with a printed circuit board (PCB).

Electrical elements for transmitting and receiving electrical signals can include electrical traces, metallization layers, electrodes, and/or electrical vias. Such elements can be formed from any useful material, such as conductive materials. Electrical elements can be connected to any useful structure to provide electrical signals to and from the active area. Such structures can include electrodes, e.g., trap electrodes, dc control electrodes, bias and signal electrodes, ring electrodes, sensing and driving electrodes, and the like.

Electrical connections (e.g., disposed outside of the vacuum vessel) can include any useful structures, such as use of bond pads. Bonding of electrical input or output to bond pads or other electrical connections can include, e.g., ball bonding, and the like.

In another example, optical signals can be delivered over optical fiber or other optical elements. In non-limiting examples, the fibers are aligned and coupled using V-groove arrays. Each V-groove is designed to align the end of an optical fiber to the face of a waveguide formed in the ion trap chip. In another example, fibers coupled by butt-end coupling to an edge-accessible optical waveguide embedded within a substrate. Optical vias may be employed to provide vertical interconnections between horizontal optical elements (e.g., waveguides). Furthermore, optical reflectors, gratings, antireflection layers, and the like may be disposed within the substrate.

Optical routing circuitry can include elements that are favored for monolithic integration within a substrate. Non-limiting elements can include optical waveguides integrated on the substrate and conformed to deliver light to the trapping sites. Such waveguides can be connected to laser beams, e.g., that provide the clock signal (e.g., clock beam), laser cooling (e.g., by use of a Doppler beam), detection beam, excitation for readout operations (e.g., by use of an excitation beam), repump (e.g., by use of a repump beam), and ionization processes (e.g., by use of a photoionization beam). In one instance, waveguides are embedded within an intermetal dielectric layer disposed within the substrate.

Optical elements can includes those for guiding any useful optical signal, such as ultraviolet beams, infrared beams, near-infrared beams, and the like. In one embodiment, the optical routing circuitry can include waveguides for a plurality of ultraviolet beams and other waveguides for a plurality of infrared beams. The ultraviolet beams may include beams for a clock signal, for Doppler cooling, for detection, and for photoionization. The infrared beams may include repump beams. In embodiments, the ultraviolet waveguides have alumina cores, and the infrared waveguides have silicon nitride cores.

The routing circuits can include other components, such as an oscillator (e.g., an optical oscillator or an oscillating circuit), a resonator (e.g., an optical resonator, an acoustic resonator, and the like), a frequency doubler, a laser source, a frequency comb, an amplifier, a diode, a photodiode, a splitter (e.g., an optical splitter), and the like.

Active Areas

The present disclosure can include the use of any useful active area configured to detect or sense an analyte or an environmental condition. Non-limiting active areas can include a surface ion trap, an ion trap, an electric potential well, DC and RC electrodes to create an electric potential well, a neutral atom sensor, an ionized atom sensor, an optically controlled atomic clock, a light-emitting diode, a micro-diode, a photodetector, a microresonator (e.g., a high-Q microresonator), an ion source, a microwave source, a light output grating, a vertical cavity surface-emitting laser, or other sensors in the field of silicon micro-electromechanical systems (MEMS), as well as arrays of any of these.

It is noteworthy in this regard that in addition to being readily manufacturable, micro-electromechanical systems also perform repeatably because structural elements can be lithographically defined. Moreover, such systems can employ a back end-of-line (BEOL) process, which makes their fabrication compatible with many integrated technologies. In one instance, a surface electrode ion trap includes an array of electric potential wells with a characteristic length scale. An illustrative range for this length scale is from 20-100 μm.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. An integrated package comprising:
   an integrated component comprising an active area, an electrical routing circuit, and an optical routing circuit, wherein the active area is disposed in proximity to a top surface of a substrate, wherein the electrical and optical routing circuits are disposed within the substrate below the top surface thereof, and wherein the active area is configured to connect with the electrical and optical routing circuits;

a vacuum vessel comprising a cap portion, a pillar portion, and a chamber, wherein the cap portion and the pillar portion are configured to define the chamber, and wherein the chamber is configured to be disposed above the active area;

a first bonding portion disposed peripherally around the active area, wherein the first bonding portion is disposed between a lower surface of the pillar portion and a top surface of the substrate; and an opening disposed within the substrate, wherein the opening is configured to provide fluidic communication to the chamber.

2. The integrated package of claim 1, wherein the first bonding portion is configured to provide a hermetic seal between the integrated component and the vacuum vessel.

3. The integrated package of claim 1, wherein the electrical routing circuit comprises one or more electrical traces, metallization layers, and/or electrical vias.

4. The integrated package of claim 1, further comprising an electrical connection that is electrically connected to the electrical routing circuit, wherein the electrical connection is disposed outside of the chamber.

5. The integrated package of claim 4, wherein the electrical routing circuit comprises one or more electrical traces, and wherein the electrical connection comprises a bond pad configured to be coupled to an electrical input or an electrical output.

6. The integrated package of claim 1, wherein the optical routing circuit comprises one or more optical waveguides, optical gratings, optical reflectors, and/or optical vias.

7. The integrated package of claim 1, further comprising an optical connection that is optically connected to the optical routing circuit, wherein the optical connection is disposed outside of the chamber.

8. The integrated package of claim 7, wherein the optical routing component comprises one or more optical waveguides, and wherein the optical connection comprises a surface or a groove configured to be coupled to an optical input or an optical output.

9. The integrated package of claim 1, further comprising an inner recessed region disposed on the top surface of the substrate, wherein the inner recessed region is defined within the chamber and located between the first bonding portion and the active area.

10. The integrated package of claim 9, further comprising an outer recessed region disposed on the top surface of the substrate, wherein the outer recessed region is defined outside of the chamber and peripherally around the first bonding portion.

11. The integrated package of claim 1, further comprising a second bonding portion disposed peripherally around the opening, wherein the second bonding portion is disposed between the bottom surface of the integrated component and a surface of a vacuum source, thereby providing a vacuum environment within the chamber.

12. The integrated package of claim 1, wherein the cap portion comprises an optically clear material.

13. The integrated package of claim 1, wherein the first bonding portion comprises a solderable material, an adhesive, an epoxy, or a eutectic bonding material.

14. The integrated package of claim 13, wherein the lower surface of the pillar portion comprises an annular cross-section, and wherein the first bonding portion comprises an annulus of the solderable material, the adhesive, or the eutectic bonding material.

15. The integrated package of claim 14, wherein the lower surface of the pillar portion comprises a first adhesion layer, wherein a top surface of the integrated component comprises a second adhesion layer, and wherein the first bonding portion is disposed between the first and second adhesion layers.

16. The integrated package of claim 1, wherein the active area comprises an ion trap, DC and RC electrodes to create an electric potential well, a neutral or ionized atom sensor, a light-emitting diode, a photodetector, a microresonator, an ion source, a light output grating, or a vertical cavity surface-emitting laser.

17. A method comprising:

providing an integrated component comprising an active area, an electrical routing circuit, an optical routing circuit, and an opening disposed within the substrate, wherein the active area is disposed in proximity to a top surface of a substrate, wherein the electrical and optical routing circuits are disposed within the substrate below the top surface thereof, and wherein the active area is configured to connect with the electrical and optical routing circuits;

aligning a vacuum vessel to a top surface of the integrated component, wherein the vacuum vessel comprises a cap portion and a pillar portion that are configured to define a chamber, and wherein the chamber is configured to be disposed above the active area and to be in fluidic communication with the opening;

bonding the vacuum vessel to the top surface of the integrated component, wherein said bonding provides a first bonding portion disposed peripherally around the active area; and applying a vacuum source to a bottom surface of the integrated component by way of the opening, thereby providing a vacuum environment within the chamber.

18. The method of claim 17, further comprising, prior to said applying the vacuum source:

bonding a surface of the vacuum source to the bottom surface of the integrated component, wherein said bonding the surface of the vacuum source provides a second bonding portion disposed on the bottom surface of the integrated component and further disposed peripherally around the opening.

19. The method of claim 18, further comprising:

providing an electrical input to an electrical connection disposed outside of the chamber, wherein the electrical connection is configured to be electrically connected to the electrical routing circuit; and providing an optical input to an optical connection disposed outside of the chamber, wherein the optical connection is configured to be optically connected to the optical routing circuit, wherein said providing the electrical input and said providing the optical input can be conducted in any order or at the same time, thereby providing an electrical signal and an optical signal to the active area.

20. The method of claim 17, further comprising, prior to said bonding the vacuum vessel:

applying a first adhesion layer on a lower surface of the pillar portion of the vacuum vessel; and applying a second adhesion layer on the top surface of the integrated component, wherein said bonding the vacuum vessel comprises providing the first bonding portion between the first and second adhesion layers.

\* \* \* \* \*